United States Patent
Lee

(10) Patent No.: US 11,342,277 B2
(45) Date of Patent: May 24, 2022

(54) SEMICONDUCTOR DEVICE ASSEMBLIES WITH CONDUCTIVE UNDERFILL DAMS FOR GROUNDING EMI SHIELDS AND METHODS FOR MAKING THE SAME

(71) Applicant: Micron Technology, Inc., Boise, ID (US)

(72) Inventor: Jungbae Lee, Taichung (TW)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/897,867

(22) Filed: Jun. 10, 2020

(65) Prior Publication Data

US 2021/0391277 A1    Dec. 16, 2021

(51) Int. Cl.
*H01L 23/552* (2006.01)
*H01L 21/56* (2006.01)

(52) U.S. Cl.
CPC .......... *H01L 23/552* (2013.01); *H01L 21/563* (2013.01)

(58) Field of Classification Search
CPC ..... H01L 23/552; H01L 21/563; H01L 21/56; H01L 2225/06537; H01L 2924/3025; H01L 21/6836; H01L 23/3737; H01L 23/42

USPC .................. 257/659; 438/121, 107
See application file for complete search history.

(56) References Cited

U.S. PATENT DOCUMENTS

| | | | |
|---|---|---|---|
| 2001/0026020 A1* | 10/2001 | Fenk | H01L 23/552 257/767 |
| 2015/0126134 A1* | 5/2015 | Lobianco | H04B 1/38 455/73 |
| 2018/0342466 A1* | 11/2018 | Lin | H01L 23/367 |
| 2020/0126887 A1* | 4/2020 | Lin | H01L 23/3737 |
| 2020/0312782 A1* | 10/2020 | Eid | H01L 23/42 |
| 2020/0381368 A1* | 12/2020 | Park | H01L 21/6836 |

* cited by examiner

*Primary Examiner* — Didarul A Mazumder
(74) *Attorney, Agent, or Firm* — Perkins Coie LLP

(57) ABSTRACT

A semiconductor device assembly is provided. The assembly includes a substrate including an upper surface having a plurality of internal contact pads and at least one grounding pad and a lower surface having a plurality of external contact pads. The assembly further includes a semiconductor die coupled to the plurality of internal contact pads, a conductive underfill dam coupled to the at least one grounding pad, and underfill material disposed at least between the semiconductor die and the substrate. The underfill material includes a fillet between the semiconductor die and the underfill dam. The assembly further includes a conductive EMI shield disposed over the semiconductor die, the fillet, and the conductive underfill dam.

20 Claims, 7 Drawing Sheets

SEMICONDUCTOR DEVICE ASSEMBLIES WITH CONDUCTIVE UNDERFILL DAMS FOR GROUNDING EMI SHIELDS AND METHODS FOR MAKING THE SAME

TECHNICAL FIELD

The present disclosure generally relates to semiconductor device assemblies, and more particularly relates to semiconductor device assemblies with conductive underfill dams for grounding EMI shields and methods for making the same.

BACKGROUND

Microelectronic devices generally have a die (i.e., a chip) that includes integrated circuitry with a high density of very small components. Typically, dies include an array of very small bond pads electrically coupled to the integrated circuitry. The bond pads are external electrical contacts through which the supply voltage, signals, etc., are transmitted to and from the integrated circuitry. After dies are formed, they are "packaged" to couple the bond pads to a larger array of electrical terminals that can be more easily coupled to the various power supply lines, signal lines, and ground lines. Conventional processes for packaging dies include electrically coupling the bond pads on the dies to an array of leads, ball pads, or other types of electrical terminals, and encapsulating the dies to protect them from environmental factors (e.g., moisture, particulates, static electricity, and physical impact).

DETAILED DESCRIPTION

Specific details of several embodiments of semiconductor devices, and associated systems and methods, are described below. A person skilled in the relevant art will recognize that suitable stages of the methods described herein can be performed at the wafer level or at the die level. Therefore, depending upon the context in which it is used, the term "substrate" can refer to a wafer-level substrate or to a singulated, die-level substrate. Furthermore, unless the context indicates otherwise, structures disclosed herein can be formed using conventional semiconductor-manufacturing techniques. Materials can be deposited, for example, using chemical vapor deposition, physical vapor deposition, atomic layer deposition, plating, electroless plating, spin coating, and/or other suitable techniques. Similarly, materials can be removed, for example, using plasma etching, wet etching, chemical-mechanical planarization, or other suitable techniques.

Some packaged semiconductor devices include a conformal conductive coating over and around an encapsulated semiconductor device to provide shielding from electromagnetic interference (EMI). One approach to providing such an EMI shield involves sputtering a metal such as copper, aluminum, or alloys thereof over a die after it has been mounted on a substrate in a flip-chip arrangement and after underfill has been dispensed around the interconnects between the die and substrate (e.g., to prevent inadvertent electrical contact between the sputtered shield and the device-to-package interconnects). One such assembly is illustrated by way of example in FIG. 1.

Figure 1:
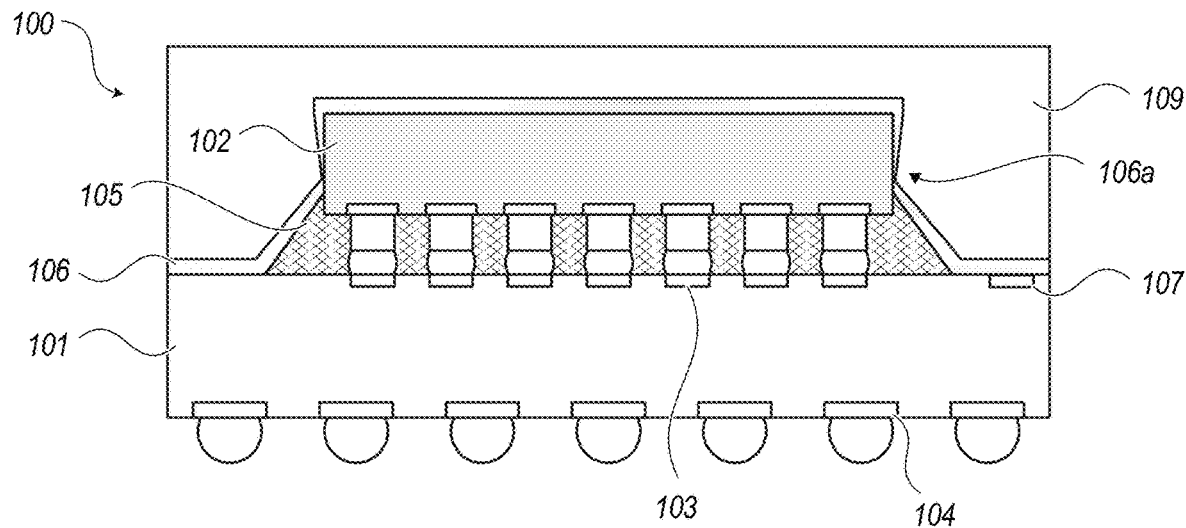
FIG. 1 is a simplified schematic cross-sectional view of an example semiconductor device assembly.

As can be seen with reference to FIG. 1, a shielded semiconductor device assembly 100 includes a substrate 101 on which is mounted a semiconductor die 102 (e.g., in a flip-chip arrangement in which a plurality of interconnects are formed between the contacts 103 on the substrate 101 and corresponding pads on the semiconductor die 102). Substrate 101 further includes package-level contact pads 104 for providing external connectivity (e.g., via solder balls) to the semiconductor die 102 (e.g., power, ground, and I/O signals) through traces, lines, vias, and other electrical connection structures (not illustrated) in the substrate 101 that electrically connect the package-level contact pads 104 to the contacts 103. An underfill material 105 (e.g., capillary underfill) is provided between the semiconductor die 102 and the substrate 101 to provide electrical insulation to the interconnects and the contacts 103. A conformal EMI shield 106 is provided over the semiconductor die 102, the portion of underfill material 105 outside of the shadow of the semiconductor die 102 (e.g., the fillet), and the portion of the substrate 101 not covered by the underfill material. To facilitate grounding the EMI shield 106, the uncovered portion of the substrate 101 can include a grounding pad 107 (e.g., connected through the electrical connection structures of the substrate to a grounded one of the package-level contact pads 104 and/or contacts 103). An encapsulant material 109 (e.g., mold resin compound or the like) is provided over and around the EMI shield 106 to prevent electrical contact therewith and to provide mechanical strength and protection to the assembly.

One drawback to this arrangement is the challenge associated with sputtering the EMI shield 106 conformally over the vertical sidewall of the semiconductor die 102. Because sputtering is generally a directional coating technique, the EMI shield 106 will be thinner on the vertical sidewall of the semiconductor die 102 than in other regions with a slope further from vertical (e.g., the horizontal upper surface of the semiconductor die 102, the angled surfaces of the fillet underfill material 105, the horizontal surfaces of the uncovered portion of the substrate 101, etc.). Because of this difference in thickness, the sputtering process may sometimes not provide adequate coverage to the vertical sidewall of the semiconductor die 102, such that openings may be formed in a generally vertical region 106a of the EMI shield 106, compromising its performance. Moreover, because the grounding pad 107 may be partially or completely covered during the dispensing of underfill material 105 before the EMI shield 106 is formed, reliable electrical contact between the EMI shield 106 and the grounding pad 107 may also be compromised.

To address these drawbacks and others, various embodiments of the present application provide semiconductor device assemblies in which a grounded underfill dam is provided. The grounded underfill dam can constrain a fillet of underfill material such that at least some, and even all, of the vertical sidewall of a semiconductor die is covered, thereby providing a sloped surface on which a sputtered EMI shield can be reliably formed. The grounded underfill dam can be further connected to one or more grounding contacts on a substrate of the assembly before underfill is dispensed, for more reliable electrical connection of the EMI shield.

Figure 2:
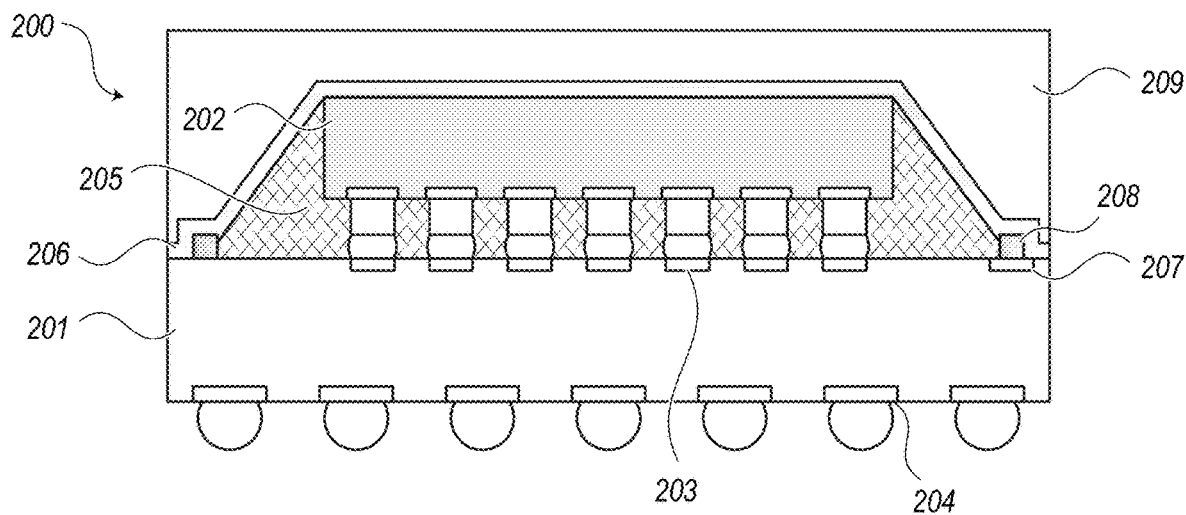
FIG. 2 is a simplified schematic cross-sectional view of a semiconductor device assembly in accordance with embodiments of the present technology.

FIG. 2 is a simplified schematic cross-sectional view of a semiconductor device assembly 200 in accordance with embodiments of the present technology. As can be seen with reference to FIG. 2, assembly 200 can include a substrate 201 on which is mounted a semiconductor die 202 (e.g., in a flip-chip arrangement in which a plurality of interconnects are formed between the contacts 203 on the substrate 201 and corresponding pads on the semiconductor die 202). Substrate 201 can further include package-level contact pads 204 for providing external connectivity (e.g., via solder balls) to the semiconductor die 202 (e.g., power, ground, and I/O signals) through traces, lines, vias, and other electrical connection structures (not illustrated) in the substrate 201 that electrically connect the package-level contact pads 204 to the contacts 203. An underfill material 205 (e.g., capillary underfill) can be provided between the semiconductor die 202 and the substrate 201 to provide electrical insulation to the interconnects and the contacts 203.

In accordance with one aspect of the present disclosure, the assembly 200 can further include one or more underfill dams, such as underfill dam 208, at least partially surrounding the semiconductor die 202. The underfill dam 208 can be configured (e.g., by selecting a height and lateral distance from the outer edge of the semiconductor die 202) to constrain a fillet of the underfill material 205 such that it covers at least a portion of (e.g., at least half of, at least two thirds of, substantially all of, etc.) the vertical sidewalls of the semiconductor die 202 (e.g., based on the slope angle of the underfill material 205 that due to its adhesion to the material of the semiconductor die 202, its viscosity, its volume, etc.). As the fillet thus constrained provides a more horizontal surface (e.g., sloped further from vertical) than the sidewall of the semiconductor die 202, a conformal EMI shield 206 formed (e.g., sputtered) after the formation of the fillet will have greater uniformity of thickness than the shield 106 illustrated in FIG. 1. The assembly 200 can further include an encapsulant material 209 (e.g., mold resin compound or the like) provided over and around the EMI shield 206 to prevent electrical contact therewith and to provide mechanical strength and protection to the assembly.

According to another aspect of the present disclosure, because the underfill dam 208 is formed prior to the dispensing of underfill material 205, it can be formed (e.g., built up in place by plating, formed separately and adhered with solder) in contact with one or more grounding pads (e.g., connected through the electrical connection structures of the substrate to a grounded one of the package-level contact pads 204 and/or contacts 203), such as grounding pad 207, without the risk of the grounding pad being first contaminated by the dispensing of underfill material.

Figure 3:
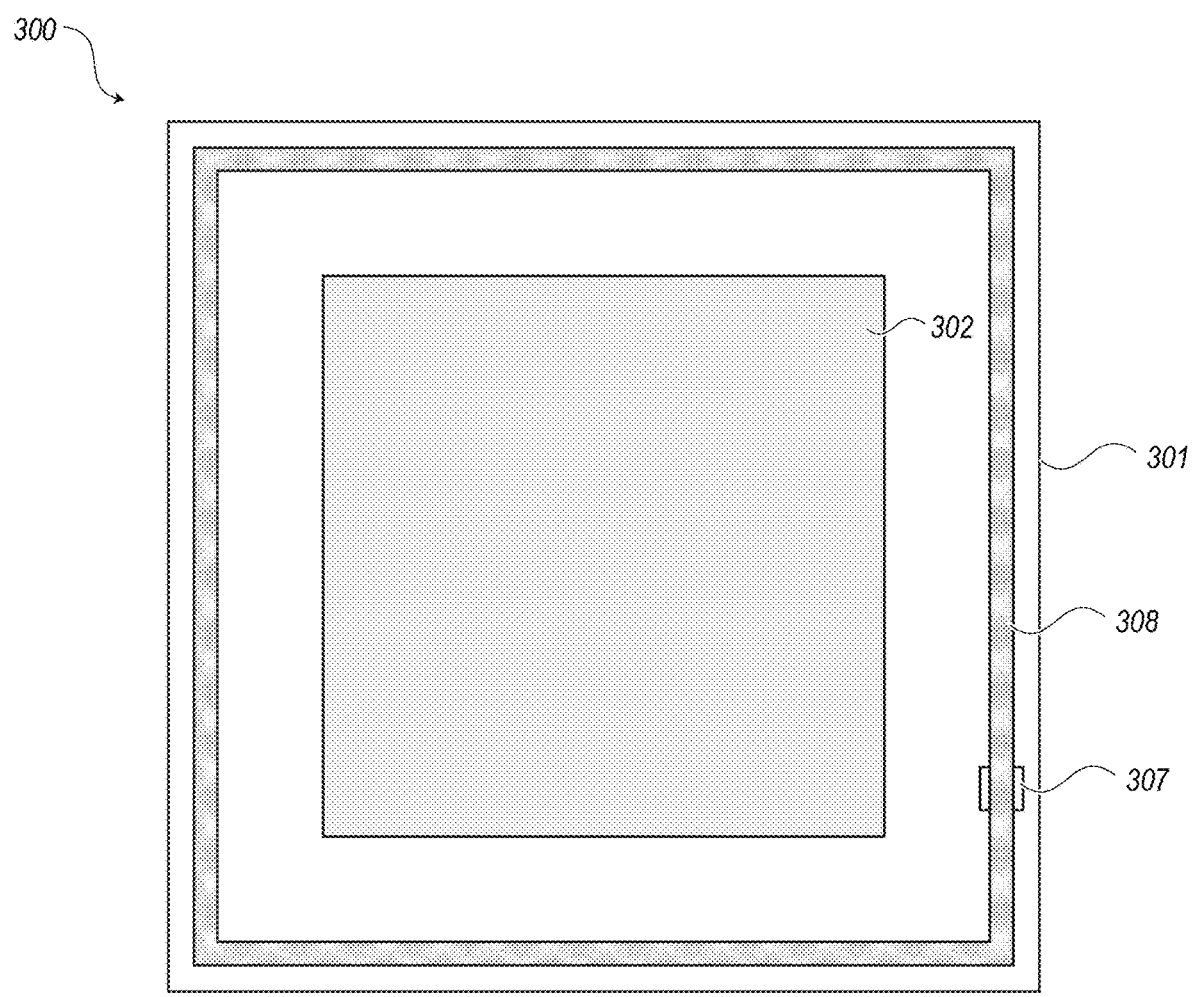
FIG. 3 is a simplified schematic partial plan view of a semiconductor device assembly in accordance with embodiments of the present technology.
Figure 4:
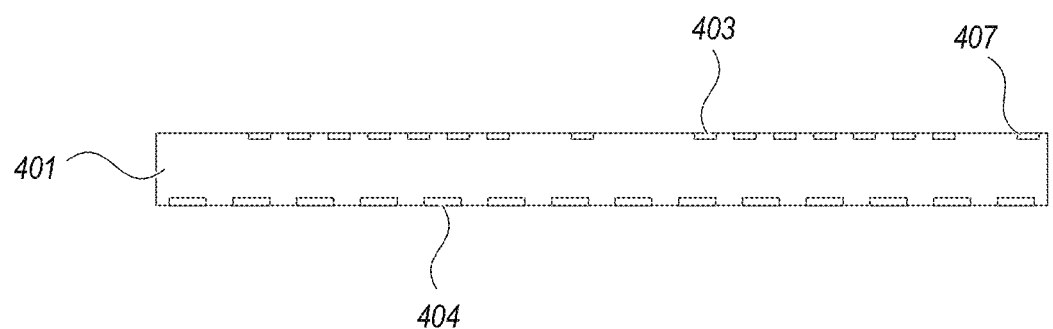
FIGS. 4-9 are simplified schematic cross-sectional views illustrating a series of fabrication steps of semiconductor device assemblies in accordance with an embodiment of the present technology.

FIG. 3 is a simplified schematic partial plan view of a semiconductor device assembly 300 in accordance with embodiments of the present technology. As can be seen with reference to FIG. 3, the assembly 300 includes a substrate 301, on which a semiconductor die 302 has been disposed (e.g., in a flip-chip arrangement). The assembly 300 further includes an underfill dam 308 at least partially surrounding the semiconductor die 302. In this regard, the underfill dam 308 can be generally annular, as illustrated in the embodiment of FIG. 3, such that it continuously surrounds the semiconductor die 302. In alternative embodiments, however, an underfill dam need not be completely continuous (e.g., it may include one or more openings, or be formed by multiple discrete and disconnected elements). Although in the current example embodiment, the underfill dam 308 is illustrated as being connected to a single grounding pad 307, in other embodiments semiconductor device assemblies can be provided in which one or more underfill dams are connected to multiple grounding pads (e.g., an underfill dam of multiple discrete elements each connected to a pad, or underfill dams of one or more elements connected to multiple grounding pads each).

FIGS. 4-9 are simplified schematic cross-sectional views illustrating a series of fabrication steps of semiconductor device assemblies in accordance with an embodiment of the present technology. Beginning with FIG. 4, a substrate 401 (e.g., in wafer-level, panel-level, strip-level, or in some embodiments, pre-singulated) is provided with one or more contacts 403, arranged to align with the contacts of a semiconductor die (set forth in greater detail below), one or more package-level contacts 404 (e.g., connected to the contacts 403 by traces, lines, vias, and other electrical connection structures as will be readily understood by those of skill in the art), and one or more grounding pads 407 (e.g., which are connected through the electrical connection structures of the substrate to corresponding grounded one(s) of the package-level contact pads 404 and/or contacts 403).

Figure 5:
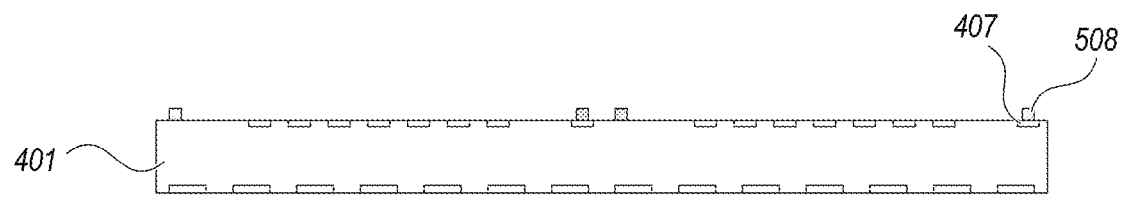

Turning to FIG. 5, a grounded underfill dam 508 can be provided around each of the pluralities of contacts 403 configured to accept a semiconductor device. Each underfill dam 508 can be configured (e.g., by selecting a height and lateral distance from the outer edge of the semiconductor die that will be provided on the corresponding plurality of contacts 403) to constrain a fillet of underfill material such that it covers at least a portion of (e.g., at least half of, at least two thirds of, substantially all of, etc.) the vertical sidewalls of the semiconductor die (e.g., based on the slope angle of the underfill material that is due to its adhesion to the material of the semiconductor die, its viscosity, its volume, etc.).

Figure 6:
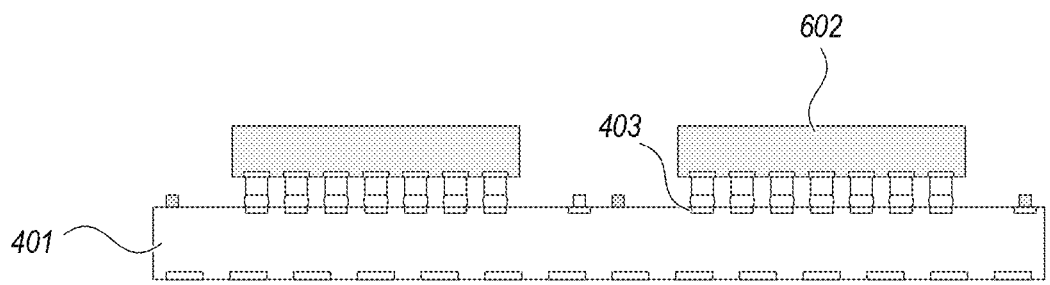
Figure 7:
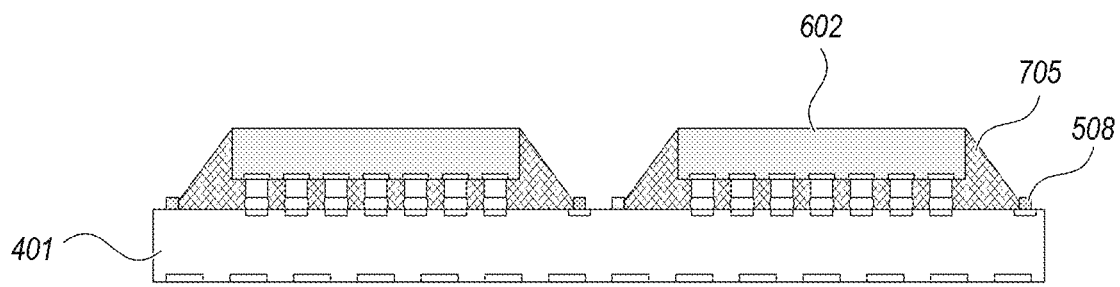

Turning next to FIG. 6, one or more semiconductor dies (e.g., a single die or a stack of dies), such as semiconductor die 602, can be provided over and electrically coupled (e.g., by a corresponding plurality of interconnects, such as solder balls, copper pillars, copper bumps, direct Cu—Cu cold welds, etc.) to the each of the pluralities of contacts 403. Turning now to FIG. 7, underfill material 705 is dispensed between each semiconductor die 602 and the substrate 401. By configuring a height and lateral spacing (e.g., from an outer vertical surface of the corresponding semiconductor die 602) of underfill dam 508, the size and shape of the fillet of underfill material 705 formed adjacent each side of each semiconductor die 602 can be controlled to provide coverage for at least some (e.g., at least half of, at least two thirds of, substantially all of, etc.) of the sidewall of each semiconductor die, thereby providing a sloped (e.g., non-vertical) surface on which a sputtered EMI shield can be reliably formed with a more uniform thickness.

Figure 8:
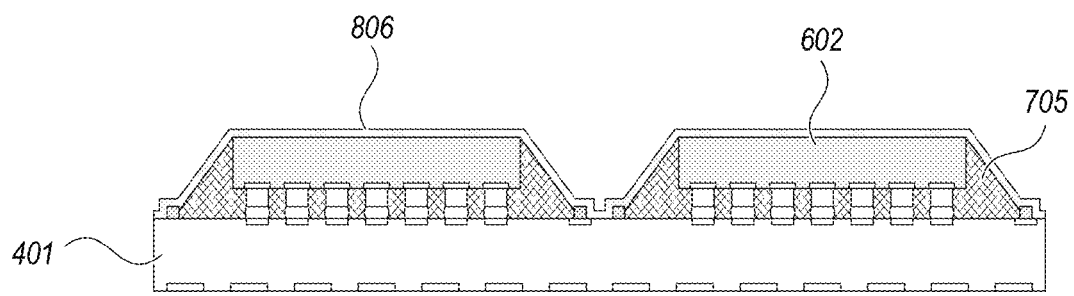
Figure 9:
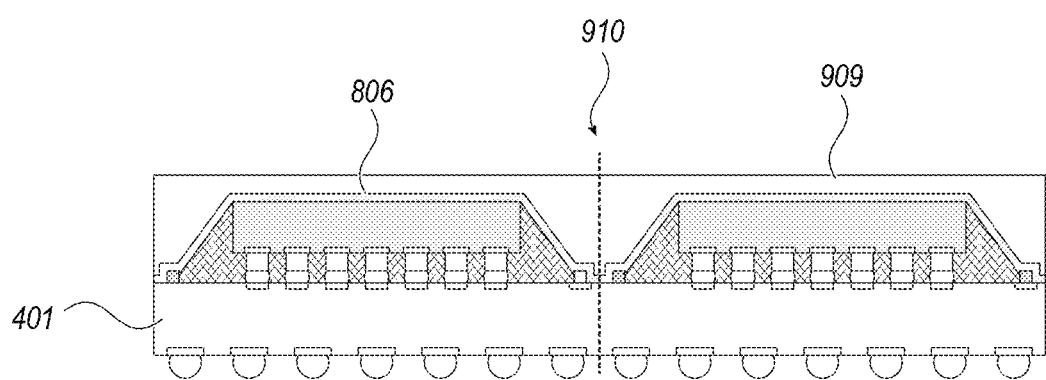

The formation of such a sputter EMI shield 806 is illustrated in FIG. 8, in accordance with one embodiment of the disclosure. As can be seen with reference to FIG. 8, the sputtered EMI shield 806 can be generally free of vertical portions due to the configuration of the fillet of the underfill material 705. Turning to FIG. 9, the encapsulant material 909 (e.g., mold resin or the like) can be provided over the EMI shields 806, solder balls or other package interconnects attached to the pads 404, and the individual assemblies can be singulated (e.g., along dicing street 910) to complete the process.

Figure 10:
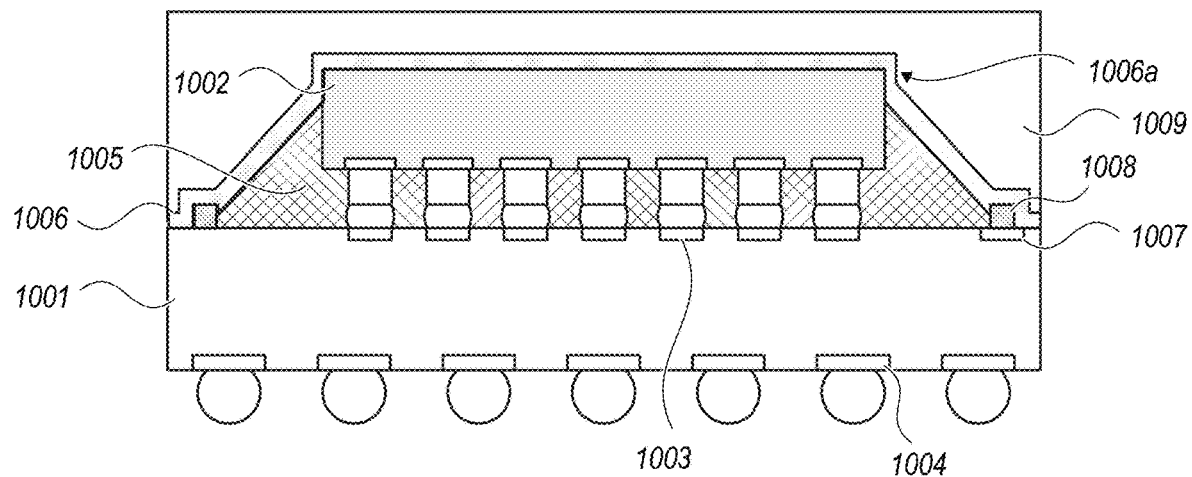
FIG. 10 is a simplified schematic cross-sectional view of a semiconductor device assembly in accordance with embodiments of the present technology.

Although in the foregoing example embodiment semiconductor device assemblies have been illustrated with fillets of underfill material which extend to the top of the vertical sidewalls of the semiconductor dies thereof, in other embodiments assemblies can be provided with fillets of underfill material that extend only part way up the vertical sidewall of the semiconductor die (e.g., less than half way up, only two-thirds of the way up, 90% of the way up, etc.). One such assembly 1000 is illustrated in the simplified schematic cross-sectional view of FIG. 10, in accordance with an embodiment of the present technology. As can be seen with reference to FIG. 10, assembly 1000 can include a substrate 1001 on which is mounted a semiconductor die 1002 (e.g., in a flip-chip arrangement in which a plurality of interconnects are formed between the contacts 1003 on the substrate 1001 and corresponding pads on the semiconductor die 1002). Substrate 1001 can further include package-level contact pads 1004 for providing external connectivity (e.g., via solder balls) to the semiconductor die 1002 (e.g., power, ground, and I/O signals) through traces, lines, vias, and other electrical connection structures (not illustrated) in the substrate 1001 that electrically connect the package-level contact pads 1004 to the contacts 1003. An underfill material 1005 (e.g., capillary underfill) can be provided between the semiconductor die 1002 and the substrate 1001 to provide electrical insulation to the interconnects and the contacts 1003.

In accordance with one aspect of the present disclosure, the assembly 1000 can further include one or more underfill dams, such as underfill dam 1008, at least partially surrounding the semiconductor die 1002. The underfill dam 1008 can be configured (e.g., by selecting a height and lateral distance from the outer edge of the semiconductor die 1002) to constrain a fillet of the underfill material 1005 such that it covers at least a portion of (e.g., at least half of, at least two thirds of, 90% of, etc.) the vertical sidewalls of the semiconductor die 1002 (e.g., based on the slope angle of the underfill material 1005 that due to its adhesion to the material of the semiconductor die 1002, its viscosity, its volume, etc.). As the fillet thus constrained provides a more horizontal surface (e.g., sloped further from vertical) than the sidewall of the semiconductor die 1002, a conformal EMI shield 1006 formed (e.g., sputtered) after the formation of the fillet will have a smaller vertical region 1006*a*, such that the risk of inadequate thickness in this region is reduced. The assembly 1000 can further include an encapsulant material 1009 (e.g., mold resin compound or the like) provided over and around the EMI shield 1006 to prevent electrical contact therewith and to provide mechanical strength and protection to the assembly.

In accordance with yet another aspect of the present disclosure, semiconductor device assemblies may also be provided with underfill fillets which extend above an upper surface of the corresponding die. Depending upon the underfill material used, and the technique and material used to form an EMI shield, such an arrangement may be less sensitive to an amount of underfill used, and may suffer no ill effects from forming an EMI shield over the excess fillet material on top of the semiconductor die. In accordance with one further aspect of the present disclosure, an underfill dam may be configured with sufficient height to ensure the underfill dam is not overtopped by the underfill material (e.g., to ensure that electrical connection between the sputtered EMI shield and the grounded underfill dam is not compromised).

Although in the foregoing example embodiment semiconductor device assemblies have been illustrated and described as including a single semiconductor device, in other embodiments assemblies can be provided with additional semiconductor devices. For example, the single semiconductor devices illustrated in FIGS. 2, 7, 8, 9, and/or 10 could be replaced with, e.g., a vertical stack of semiconductor devices, a plurality of semiconductor devices, mutatis mutandis.

In accordance with one aspect of the present disclosure, the semiconductor devices illustrated in the assemblies of FIGS. 2-10 could be memory dies, such as dynamic random access memory (DRAM) dies, NOT-AND (NAND) memory dies, NOT-OR (NOR) memory dies, magnetic random access memory (MRAM) dies, phase change memory (PCM) dies, ferroelectric random access memory (FeRAM) dies, static random access memory (SRAM) dies, or the like. In an embodiment in which multiple dies are provided in a single assembly, the semiconductor devices could be memory dies of a same kind (e.g., both NAND, both DRAM, etc.) or memory dies of different kinds (e.g., one DRAM and one NAND, etc.). In accordance with another aspect of the present disclosure, the semiconductor dies of the assemblies illustrated and described above could be logic dies (e.g., controller dies, processor dies, etc.), or a mix of logic and memory dies (e.g., a memory controller die and a memory die controlled thereby).

Figure 11:
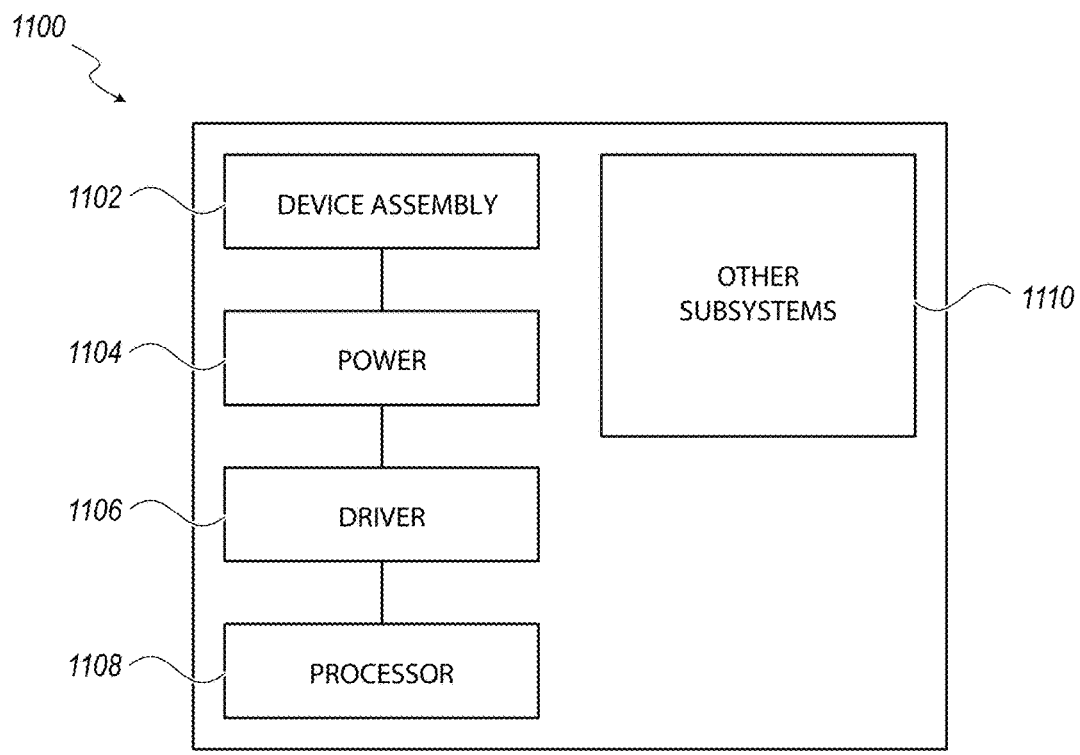
FIG. 11 is a schematic view showing a system that includes a semiconductor device assembly configured in accordance with an embodiment of the present technology.

Any one of the semiconductor devices and semiconductor device assemblies described above with reference to FIGS. 2-10 can be incorporated into any of a myriad of larger and/or more complex systems, a representative example of which is system 1100 shown schematically in FIG. 11. The system 1100 can include a semiconductor device assembly (e.g., or a discrete semiconductor device) 1102, a power source 1104, a driver 1106, a processor 1108, and/or other subsystems or components 1110. The semiconductor device assembly 1102 can include features generally similar to those of the semiconductor devices described above with reference to FIGS. 2-10. The resulting system 1100 can perform any of a wide variety of functions, such as memory storage, data processing, and/or other suitable functions. Accordingly, representative systems 1100 can include, without limitation, hand-held devices (e.g., mobile phones, tablets, digital readers, and digital audio players), computers, vehicles, appliances and other products. Components of the system 1100 may be housed in a single unit or distributed over multiple, interconnected units (e.g., through a communications network). The components of the system 1100 can also include remote devices and any of a wide variety of computer readable media.

Figure 12:
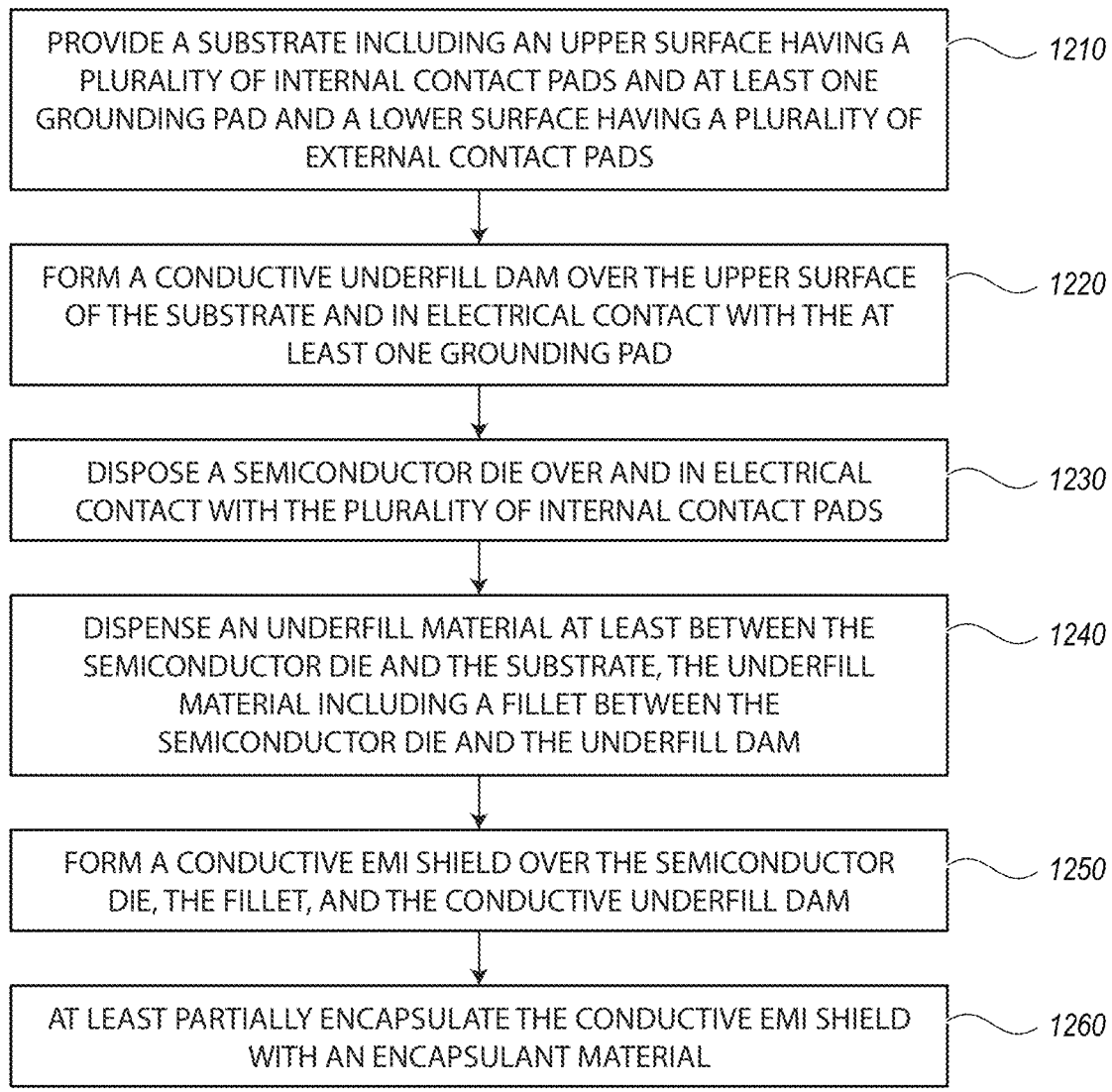
FIG. 12 is a flow chart illustrating a method of making a semiconductor device assembly in accordance with an embodiment of the present technology.

FIG. 12 is a flow chart illustrating a method of making a semiconductor device assembly. The method includes providing a substrate including an upper surface having a plurality of internal contact pads and at least one grounding pad and a lower surface having a plurality of external contact pads (box 1210). The method further includes forming a conductive underfill dam over the upper surface of the substrate and in electrical contact with the at least one grounding pad (box 1220). The method further includes disposing a semiconductor die over and in electrical contact with the plurality of internal contact pads (box 1230). The method further includes dispensing an underfill material at least between the semiconductor die and the substrate, the underfill material including a fillet between the semiconductor die and the underfill dam (box 1240). The method further includes forming a conductive EMI shield over the semiconductor die, the fillet, and the conductive underfill dam (box 1250). The method further includes at least partially encapsulating the conductive EMI shield with an encapsulant material (box 1260).

The devices discussed herein, including a memory device, may be formed on a semiconductor substrate or die, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

The functions described herein may be implemented in hardware, software executed by a processor, firmware, or any combination thereof. Other examples and implementations are within the scope of the disclosure and appended claims. Features implementing functions may also be physically located at various positions, including being distributed such that portions of functions are implemented at different physical locations.

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

As used herein, the terms "vertical," "lateral," "upper," "lower," "above," and "below" can refer to relative directions or positions of features in the semiconductor devices in view of the orientation shown in the Figures. For example, "upper" or "uppermost" can refer to a feature positioned closer to the top of a page than another feature. These terms, however, should be construed broadly to include semiconductor devices having other orientations, such as inverted or inclined orientations where top/bottom, over/under, above/below, up/down, and left/right can be interchanged depending on the orientation.

It should be noted that the methods described above describe possible implementations, and that the operations and the steps may be rearranged or otherwise modified and that other implementations are possible. Furthermore, embodiments from two or more of the methods may be combined.

From the foregoing, it will be appreciated that specific embodiments of the invention have been described herein for purposes of illustration, but that various modifications may be made without deviating from the scope of the invention. Rather, in the foregoing description, numerous specific details are discussed to provide a thorough and enabling description for embodiments of the present technology. One skilled in the relevant art, however, will recognize that the disclosure can be practiced without one or more of the specific details. In other instances, well-known structures or operations often associated with memory systems and devices are not shown, or are not described in detail, to avoid obscuring other aspects of the technology. In general, it should be understood that various other devices, systems, and methods in addition to those specific embodiments disclosed herein may be within the scope of the present technology.

What is claimed is:

1. A semiconductor device assembly, comprising:
   a substrate including an upper surface having a plurality of internal contact pads and at least one grounding pad and a lower surface having a plurality of external contact pads;
   a semiconductor die coupled to the plurality of internal contact pads;
   a conductive underfill dam coupled to the at least one grounding pad;
   an underfill material disposed at least between the semiconductor die and the substrate, wherein the underfill material includes a fillet between the semiconductor die and the conductive underfill dam, wherein the fillet includes a first sloped surface extending from a periphery of the semiconductor die to the conductive underfill dam; and
   a conductive EMI shield disposed over the semiconductor die, the fillet, and the conductive underfill dam, wherein the conductive EMI shield includes a second sloped surface conformal with the first sloped surface, wherein the conductive underfill dam has both a height above the upper surface and a lateral spacing from the semiconductor die configured to intersect the first sloped surface of the fillet with an elevated portion of the conductive underfill dam.

2. The semiconductor device assembly of claim 1, wherein the fillet extends vertically at least half way up an outer surface of the semiconductor die.

3. The semiconductor device assembly of claim 1, wherein the fillet extends vertically to an upper surface of the semiconductor die.

4. The semiconductor device assembly of claim 1, wherein the conductive EMI shield is electrically grounded through the conductive underfill dam and the at least one grounding pad.

5. The semiconductor device assembly of claim 1, wherein the conductive underfill dam is generally annular and surrounds a periphery of the semiconductor die.

6. The semiconductor device assembly of claim 1, wherein the height of the conductive underfill dam is configured to constrain the underfill material from overflowing the conductive underfill dam.

7. The semiconductor device assembly of claim 6, wherein the height of the conductive underfill dam is further configured to cause the fillet to extend vertically at least partway up an outer surface of the semiconductor die.

8. The semiconductor device assembly of claim 1, wherein the conductive EMI shield extends continuously over an upper surface of the semiconductor die and over the fillet without any openings.

9. The semiconductor device assembly of claim 1, further comprising an encapsulant material at least partially encapsulating the conductive EMI shield.

10. A method of making a semiconductor device assembly, comprising:
   providing a substrate including an upper surface having a plurality of internal contact pads and at least one grounding pad and a lower surface having a plurality of external contact pads;
   forming a conductive underfill dam over the upper surface of the substrate and in electrical contact with the at least one grounding pad;
   disposing a semiconductor die over and in electrical contact with the plurality of internal contact pads;
   dispensing an underfill material at least between the semiconductor die and the substrate, the underfill material including a fillet between the semiconductor die and the underfill dam, wherein the fillet includes a first sloped surface extending from a periphery of the semiconductor die to intersect with an elevated portion of the conductive underfill dam extending above the upper surface; and
   forming a conductive EMI shield over the semiconductor die, the fillet, and the conductive underfill dam, wherein the conductive EMI shield includes a second sloped surface conformal with the first sloped surface.

11. The method of claim 10, wherein the fillet extends vertically at least half way up an outer surface of the semiconductor die.

12. The method of claim 10, wherein the fillet extends vertically to an upper surface of the semiconductor die.

13. The method of claim 10, wherein the conductive EMI shield is electrically grounded through the conductive underfill dam and the at least one grounding pad.

14. The method of claim 10, wherein the conductive underfill dam is generally annular and surrounds a periphery of the semiconductor die.

15. The method of claim 10, wherein the conductive underfill dam has a height configured to constrain the underfill material from overflowing the conductive underfill dam.

16. The method of claim 15, wherein the height of the conductive underfill dam is further configured to cause the fillet to extend vertically at least partway up an outer surface of the semiconductor die.

17. The method of claim 10, wherein the conductive EMI shield extends continuously over an upper surface of the semiconductor die and over the fillet without any openings.

18. The method of claim 10, further comprising at least partially encapsulating the conductive EMI shield with an encapsulant material.

19. A semiconductor device assembly, comprising:
   a substrate including an upper surface having a plurality of internal contact pads and at least one grounding pad and a lower surface having a plurality of external contact pads;
   at least one semiconductor die coupled to the plurality of internal contact pads;
   a conductive underfill dam coupled to the at least one grounding pad;
   an underfill material disposed at least between the at least one semiconductor die and the substrate, wherein the underfill material includes a fillet between the at least one semiconductor die and the conductive underfill dam, wherein the fillet includes a first sloped surface extending from a periphery of the at least one semiconductor die to the conductive underfill dam;
   a conductive EMI shield disposed over the at least one semiconductor die, the fillet, and the conductive underfill dam, wherein the conductive EMI shield includes a second sloped surface conformal with the first sloped surface; and
   an encapsulant material at least partially encapsulating the conductive EMI shield,
   wherein the conductive underfill dam has both a height above the upper surface and a lateral spacing from the semiconductor die configured to intersect the first sloped surface of the fillet with an elevated portion of the conductive underfill dam.

20. The semiconductor device assembly of claim 19, wherein the at least one semiconductor die comprises a vertical stack of semiconductor dies.

* * * * *